(12) United States Patent
Nakamura

(10) Patent No.: US 7,910,459 B2
(45) Date of Patent: *Mar. 22, 2011

(54) METHOD OF MANUFACTURING DEVICE HAVING A UV-CURABLE ADHESIVE

(75) Inventor: Masaru Nakamura, Ota-Ku (JP)

(73) Assignee: Disco Corporation, Tokyo (JP)

( * ) Notice: Subject to any disclaimer, the term of this patent is extended or adjusted under 35 U.S.C. 154(b) by 165 days.

This patent is subject to a terminal disclaimer.

(21) Appl. No.: 12/038,224

(22) Filed: Feb. 27, 2008

(65) Prior Publication Data

US 2008/0220591 A1    Sep. 11, 2008

(30) Foreign Application Priority Data

Mar. 9, 2007 (JP) .................... 2007-060136

(51) Int. Cl.
*H01L 21/00* (2006.01)
(52) U.S. Cl. .............. 438/463; 438/464; 257/E21.599
(58) Field of Classification Search .......... 438/463, 438/464; 257/E21.599
See application file for complete search history.

(56) References Cited

U.S. PATENT DOCUMENTS

| 7,341,926 B2 * | 3/2008 | Nakamura | 438/463 |
| 2002/0042189 A1 * | 4/2002 | Tanaka | 438/450 |
| 2008/0233712 A1 * | 9/2008 | Sekiya | 438/462 |

FOREIGN PATENT DOCUMENTS

| JP | A 2000-182995 | 6/2000 |
| JP | A 2002-118081 | 4/2002 |

* cited by examiner

*Primary Examiner* — David S Blum
*Assistant Examiner* — Vicki B Booker
(74) *Attorney, Agent, or Firm* — Greer, Burns & Crain, Ltd.

(57) ABSTRACT

A method of manufacturing a device, including the steps of forming dividing grooves with a predetermined depth along planned dividing lines of a wafer, then grinding the back-side surface of the wafer to expose the dividing grooves on the back side, dividing the wafer into individual devices, attaching a UV-curable adhesive film to the backside surface of the wafer divided into the individual devices, adhering the adhesive film side of the wafer to a dicing tape attached to an annular frame, radiating UV rays from the face side of the wafer to cure those regions of the adhesive film which correspond to the dividing grooves, radiating a laser beam along the dividing grooves to divide the cured adhesive film on a device basis, and releasing the devices from the dicing tape, thereby picking up the devices.

2 Claims, 12 Drawing Sheets

FIG. 1 1 A
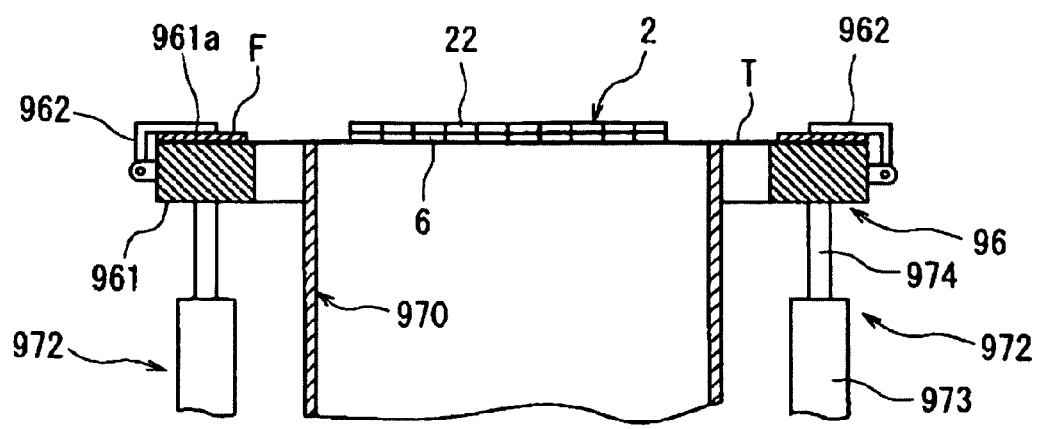
FIG. 1 1 B
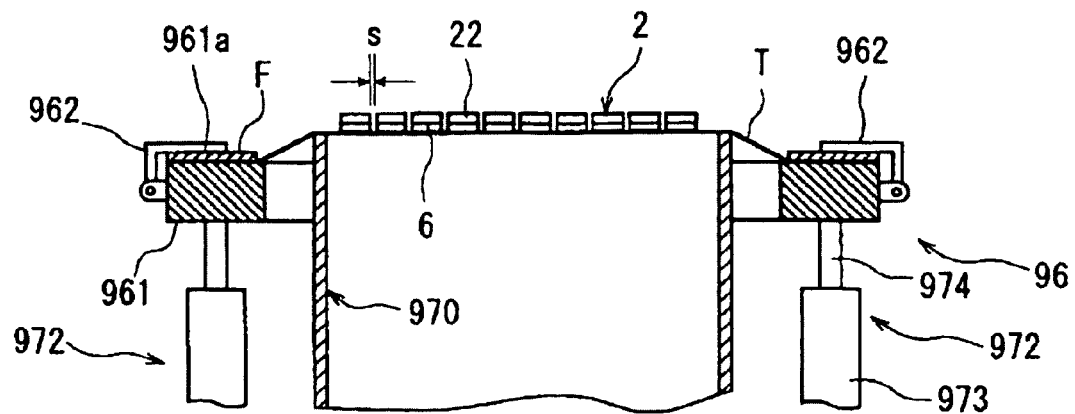

METHOD OF MANUFACTURING DEVICE HAVING A UV-CURABLE ADHESIVE

BACKGROUND OF THE INVENTION

1. Field of the Invention

The present invention relates to a method of manufacturing a device by which a wafer provided with devices formed in a plurality of regions demarcated by planned dividing lines formed in a lattice form in a face-side surface thereof is divided along the planned dividing lines into individual devices and a die-bonding adhesive film is attached to the back side of each of the devices.

2. Description of the Related Art

For example, in the manufacturing process of a semiconductor device, devices such as ICs and LSIs are formed in a plurality of regions demarcated by streets (planned dividing lines) formed in a lattice pattern in the face-side surface of a semiconductor wafer having a roughly circular disk-like shape, and the regions with the devices formed therein are divided along the planned dividing lines, to thereby manufacture the individual devices. As a dividing apparatus for dividing the semiconductor wafer, a cutting apparatus called dicing apparatus is normally used. The cutting apparatus cuts the semiconductor wafer along the planned dividing lines by a cutting blade having a thickness of about 40 μm. The devices divided in this manner are packaged, to be used widely in electric apparatuses such as cellular phones, personal computers, etc.

To the backside surface of each of the devices thus divided individually, a die-bonding adhesive film called die attachment film which is formed of an epoxy resin or the like and having a thickness of 70 to 80 μm is attached, and the device is bonded to a die bonding frame for supporting the device through the adhesive film by heating. The die-bonding adhesive film is attached to the backside surfaces of the devices by, for example, a method in which the adhesive film is adhered to the backside surface of the semiconductor wafer, the semiconductor wafer is adhered to the dicing tape through the adhesive film, and the adhesive film is cut together with the semiconductor wafer by a cutting blade along planned dividing lines formed in the face-side surface of the semiconductor wafer, to thereby obtain the devices each with the adhesive film attached to the backside surface thereof (refer to, for example, Japanese Patent Laid-Open No. 2000-182995).

In recent years, electric apparatuses such as cellular phones and personal computers have been desired to be reduced in weight and size, and there is a demand for thinner devices. As a technology for dividing devices in a thinner form, a dividing technology called "dicing-before-grinding" has been put to practical use. The dicing-before-grinding method is a technology in which dividing grooves are formed in a semiconductor wafer in a predetermined depth (a depth corresponding to the finished thickness of devices) along planned dividing lines from the face side of the semiconductor wafer, and then the backside surface of the semiconductor wafer provided with the dividing grooves in the face-side surface thereof is ground to expose the dividing grooves on the back side, thereby dividing the semiconductor wafer into the individual devices. By the dicing-before-grinding method, the devices can be machined to have a thickness of 100 μm or below.

However, in the case of dividing a semiconductor wafer into individual devices by the dicing-before-grinding technique, the dividing grooves are formed in the semiconductor wafer in a predetermined depth along the planned dividing lines from the face side of the semiconductor wafer and, thereafter, the backside surface of the semiconductor device is ground to expose the dividing grooves on the back side. Therefore, a die-bonding adhesive film cannot be preliminarily attached to the backside surface of the semiconductor wafer. As a result, bonding to a die bonding frame the device manufactured by the dicing-before-grinding method has to be carried out while inserting a bonding agent between the device and the die bonding frame, which makes it very difficult to smoothly perform the bonding work.

To solve such a problem, there has been proposed a semiconductor device manufacturing method in which a die-bonding adhesive film is attached to the backside surface of the semiconductor wafer divided into individual devices by the dicing-before-grinding technique, the semiconductor wafer is adhered to a dicing tape through the adhesive film, and then the parts of the adhesive film which are exposed in the gaps between the devices are chemically etched away; besides, there has also been proposed a semiconductor device manufacturing method in which the parts of the adhesive film which are exposed in the gaps between the devices are irradiated with a laser beam through the gap from the face side of the devices, to remove the parts of the adhesive film which are exposed in the gaps (refer to, for example, Japanese Patent Laid-Open No. 2002-118081).

Incidentally, in order to cut the adhesive film by irradiation with a laser beam, the adhesive film has to be irradiated with a laser beam having such a wavelength as to permit absorption into the adhesive film (for example, 355 nm) and a mean output of about 2 W. Since the laser beam with a mean output of about 2 W is comparatively strong in output, irradiation of the adhesive film with the laser beam causes scattering of debris, and the scattered debris would adhere to the surfaces of the devices, thereby lowering the device quality.

SUMMARY OF THE INVENTION

Accordingly, it is an object of the present invention to provide a method of manufacturing a device by which it is possible to attach a die-bonding adhesive film to the backside surface of each of individual devices divided from a wafer by the dicing-before-grinding technique, easily and without lowering the device quality.

In accordance with an aspect of the present invention, there is provided a method of manufacturing a device, for dividing a wafer provided with devices formed in a plurality of regions demarcated by planned dividing lines formed in a lattice pattern in a face-side surface thereof, into individual devices, the method including: a wafer dividing step of forming dividing grooves in a predetermined depth along the planned dividing lines from the face side of the wafer, then grinding a backside surface of the wafer to expose the dividing grooves on the back side of the wafer and dividing the wafer into the individual devices; an adhesive film attaching step of attaching a UV-curing adhesive film to the backside surface of the wafer divided into the individual devices; a wafer supporting step of adhering the adhesive film side of the wafer with the adhesive film attached thereto to a surface of a dicing tape attached to an annular frame; an adhesive film curing step of radiating UV rays from the face side of the wafer adhered to the dicing tape so as to irradiate the adhesive film with the UV rays through the dividing grooves formed in the wafer and thereby to cure those regions of the adhesive film which correspond to the dividing grooves; an adhesive film dividing step of radiating a laser beam having such a wavelength as to permit absorption into the adhesive film, from the face side of the wafer and along the dividing grooves, so as to divide the cured adhesive film on a device basis along the dividing grooves; and a pick-up step of releasing from the dicing tape, and picking up, each of the devices to which the adhesive film divided on the device basis has been attached.

The pick-up step desirably includes a tape expanding step of expanding the dicing tape so as to broaden the gaps between the devices, before releasing from the dicing tape each of the devices to which the adhesive film has been attached.

According to the present invention, at the time of performing the adhesive film dividing step of dividing the adhesive film on a device basis by radiating a laser beam having such a wavelength as to permit absorption into the adhesive film, from the face side of the wafer and along the dividing grooves, the adhesive film has been cured in the regions corresponding to the dividing grooves by carrying out the adhesive film curing step, so that good absorption of the laser beam is promised. Therefore, the adhesive film can be cut with a laser beam having a weak output of about 1 W, and, accordingly, generation of debris can be suppressed. In addition, since the laser beam is applied to the regions where the adhesive film has been cured, the adhesive film is securely cut along the laser beam with which it is irradiated, and clear cutting of the adhesive film along the devices is achieved.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 11A and 11B illustrates a tape expanding step in the pick-up step in the method of manufacturing a device based on the present invention.

DETAILED DESCRIPTION OF THE PREFERRED EMBODIMENTS

Figure 1:
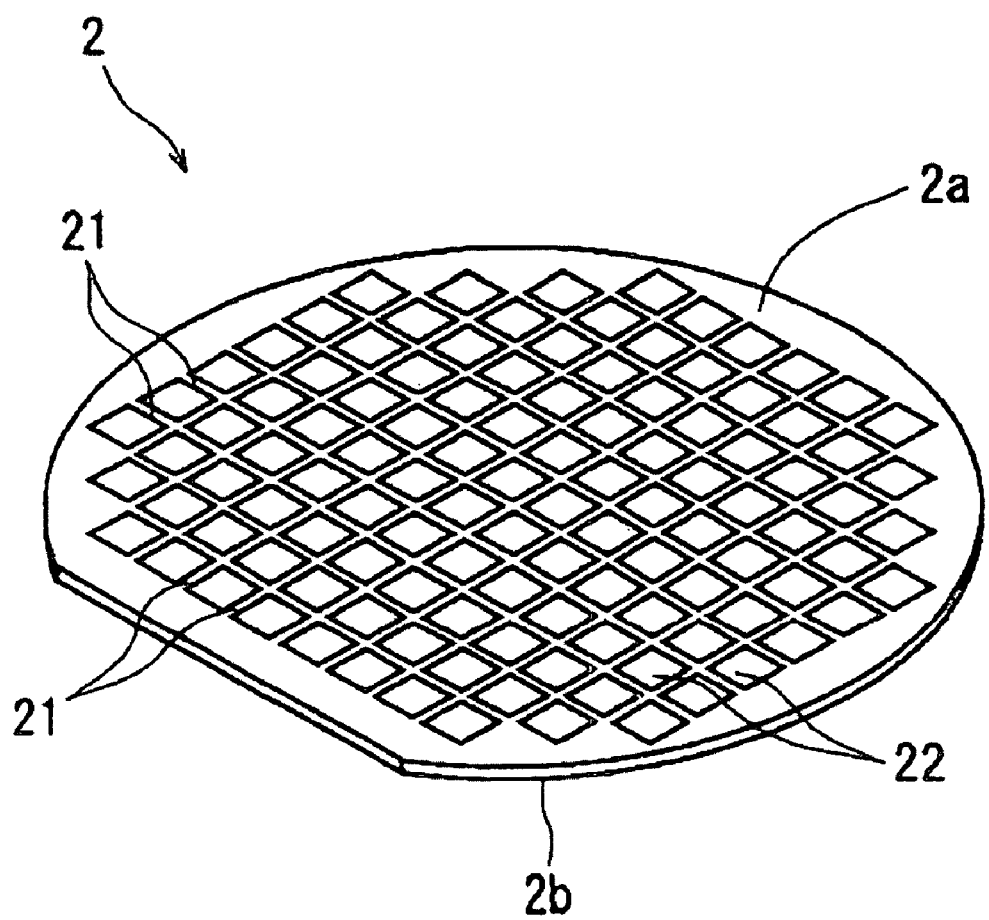
FIG. 1 is a perspective view of a semiconductor wafer as a wafer in the present invention.

Now, a preferred embodiment of the method of manufacturing a device based on the present invention will be described in detail below, referring to the attached drawings. FIG. 1 shows a perspective view of a semiconductor wafer as a wafer in the invention. The semiconductor wafer 2 shown in FIG. 1 is, for example, a silicon wafer having a thickness of 600 µm, which is provided in its face-side surface 2a with a plurality of planned dividing lines 21 in a lattice pattern. On the face-side surface 2a of the semiconductor wafer 2, in addition, devices 22 such as ICs and LSIs are formed in a plurality of regions demarcated by the plurality of planned dividing lines 21 formed in the lattice pattern.

Figure 2A:
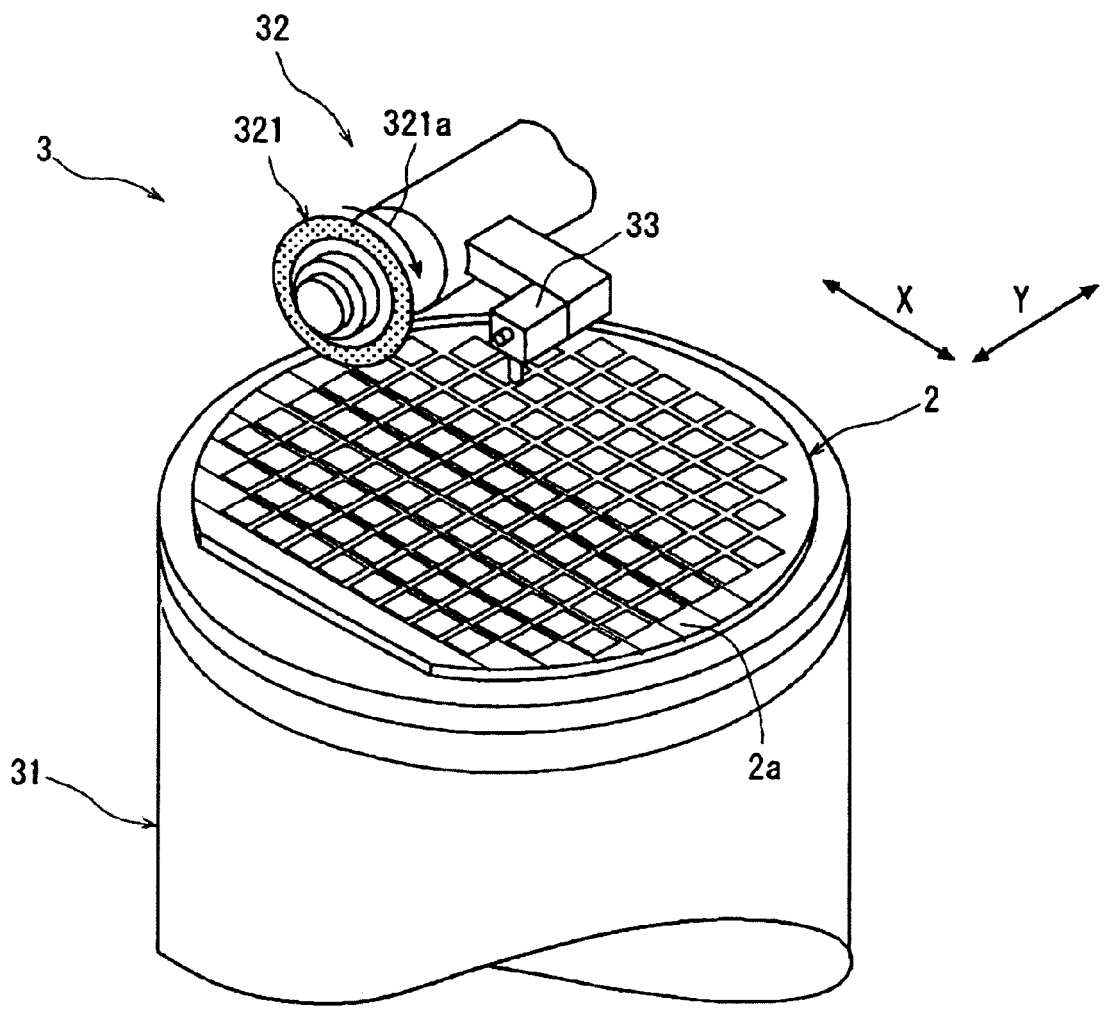
FIGS. 2A and 2B illustrate a dividing groove forming step in a wafer dividing step in the method of manufacturing a device based on the present invention.

The semiconductor wafer 2 shown in FIG. 1 is divided into the individual devices 22 by carrying out a wafer dividing step based on the so-called dicing-before-grinding method. In the wafer dividing step based on the dicing-before-grinding technique, first, dividing grooves with a predetermined depth (a depth corresponding to a finished thickness of the devices) are formed along the planned dividing lines 21 formed in the face-side surface 2a of the semiconductor wafer 2 (dividing groove forming step). The dividing groove forming step is carried out by use of a cutting apparatus 3 shown in FIG. 2A. The cutting apparatus 3 shown in FIG. 2A includes a chuck table 31 equipped with suction holding means, cutting means 32 equipped with a cutting blade 321, and imaging means 33. In carrying out the dividing groove forming step, the semiconductor wafer 2 is mounted on the chuck table 31, with its face-side surface 2a up. Then, suction means (not shown) is operated to thereby hold the semiconductor wafer 2 on the chuck table 31. The chuck table 31 with the semiconductor wafer 2 suction held thereon in this manner is positioned into a position directly under the imaging means 33 by a cutting feeding mechanism (not shown).

When the chuck table 31 is positioned in the position just under the imaging means 33, an alignment work is carried out in which a cutting region, where to form a dividing groove, of the semiconductor wafer 2 is detected by the imaging means 33 and control means (not shown). Specifically, the imaging means 33 and the control means (not shown) execute image processing such as pattern matching for matching the positions of the planned dividing line 21 formed in the semiconductor wafer 2 along a predetermined direction and the cutting blade 321, so as to perform alignment of the cutting region (alignment step). In addition, for the planned dividing line 21 formed in the semiconductor wafer 2 to extend perpendicularly to the predetermined direction, also, similar alignment of the cutting region is carried out.

Figure 2B:
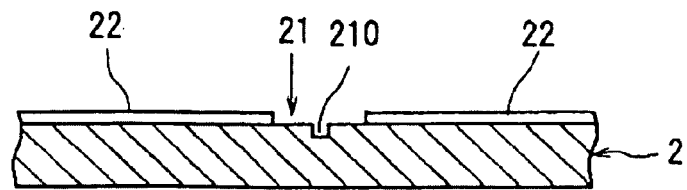

After the alignment of the cutting region of the semiconductor wafer 2 held on the chuck table 31 is conducted as above, the chuck table 31 holding the semiconductor wafer 2 thereon is moved to a cutting starting position of the cutting region. Then, the cutting blade 321 is moved downwards while being rotated in the direction of arrow 321a in FIG. 2A, to perform a predetermined amount of cutting-in feed. The cutting-in feed position in this case is so set that an outer peripheral edge of the cutting blade 321 reaches a depth position (for example, 110 µm) corresponding to the finished thickness of the device from the face-side surface of the semiconductor wafer 2. After the cutting-in feed of the cutting blade 321 is thus conducted, the chuck table 31 is put into cutting feed in the direction of arrow X in FIG. 2A while keeping the cutting blade 321 in rotation, whereby a dividing groove 210 with a depth (for example, 110 µm) corresponding to the finished thickness of the device is formed along the planned dividing line 21 as shown in FIG. 2B (dividing groove forming step). This dividing groove forming step is carried out along all the planned dividing lines 21 formed in the semiconductor wafer 2.

Figure 3A:
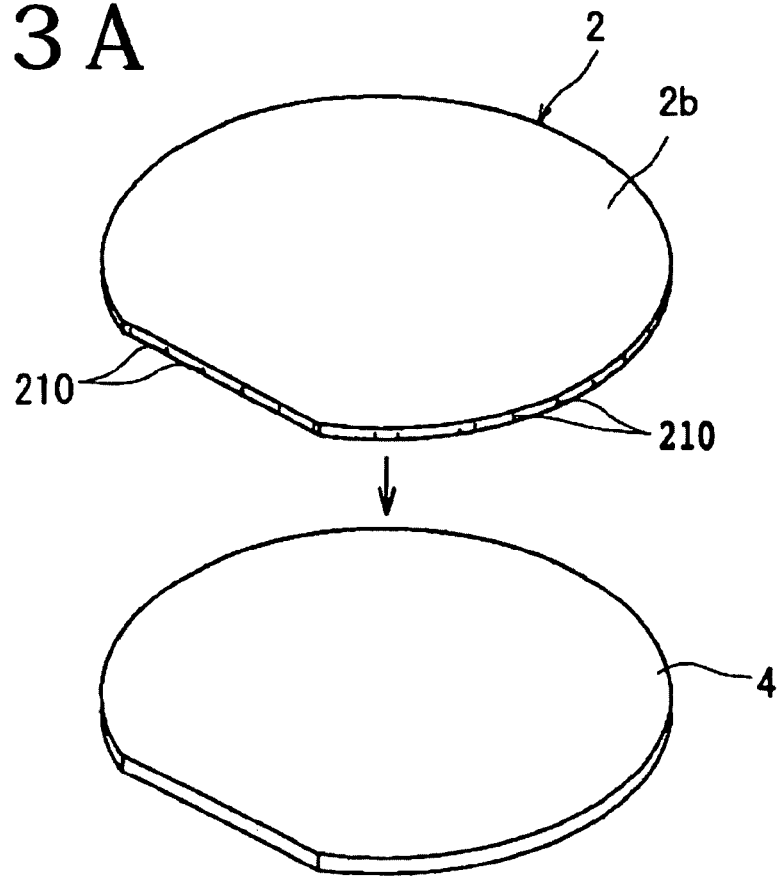
FIGS. 3A and 3B illustrate a protective member adhering step in the wafer dividing step in the method of manufacturing a device based on the present invention.
Figure 3B:
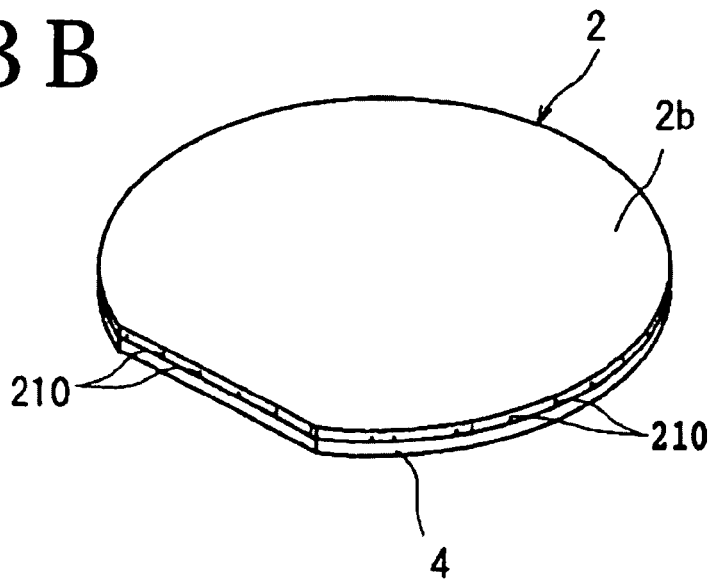

After the dividing grooves 210 with the predetermined depth are formed in the face-side surface 2a of the semiconductor wafer 2 along the planned dividing lines 21 by the dividing groove forming step described above, a protective member 4 for grinding is adhered to the face-side surface 2a (the surface on which the devices 22 are formed) of the semiconductor wafer 2 as shown in FIGS. 3A and 3B (protective member adhering step). Incidentally, the protective member 4, in the embodiment shown, includes a polyolefin sheet having a thickness of 150 μm.

Figure 4A:
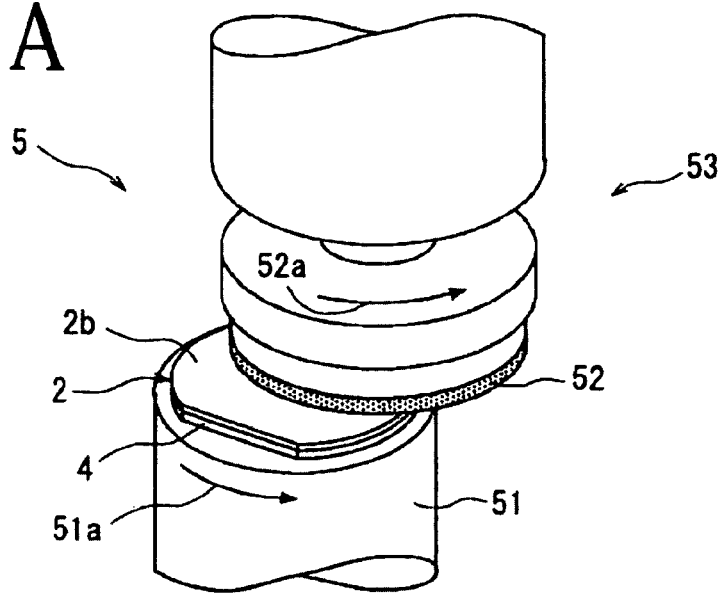
FIGS. 4A to 4C illustrate a dividing groove exposing step in the wafer dividing step in the method of manufacturing a device based on the present invention.
Figure 4B:
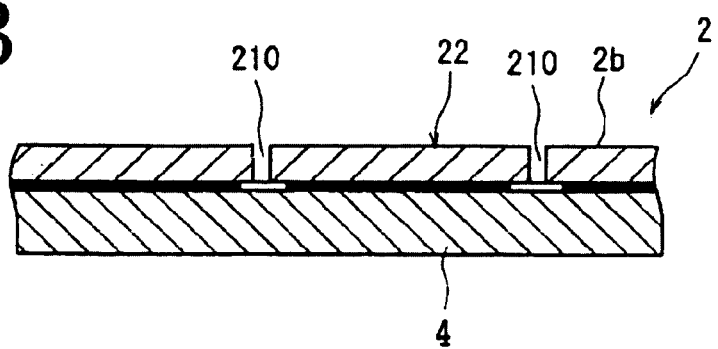
Figure 4C:
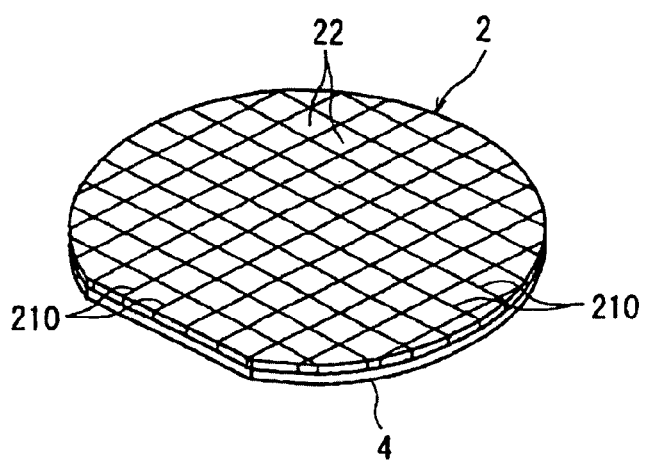

Next, a backside surface 2b of the semiconductor wafer 2 carrying the protective member 4 adhered to its face-side surface 2a thereof is ground so as to expose the dividing grooves 210 at the backside surface 2b, thereby dividing the semiconductor wafer 2 into individual devices (dividing groove exposing step). The dividing groove exposing step is carried out by a chuck table 51 and a grinding apparatus 5 including grinding means 53 having a grindstone 52, as shown in FIG. 4A. Specifically, the semiconductor wafer 2 is held on the chuck table 51 with its backside surface 2b up, the chuck table 51 is kept rotating, for example, at a speed of 300 rpm in the direction of arrow 51a, the grindstone 52 of the grinding means 53 is rotated at 6,000 rpm in the direction of arrow 52a, and the grindstone 52 is brought into contact with the backside surface 2b of the semiconductor wafer 2, thereby grinding the backside surface 2b until the grinding grooves 210 are exposed at the backside surface 2b as shown in FIG. 4B. By grinding the backside surface 2b until the grinding grooves 210 are exposed, the semiconductor wafer 2 is divided into the individual devices 22 as shown in FIG. 4C. Incidentally, the plurality of devices 22 thus divided are not separated away from each other and the form of the semiconductor wafer 2 is retained, since the protective member 4 is adhered to the face side of the devices 22.

Figure 5A:
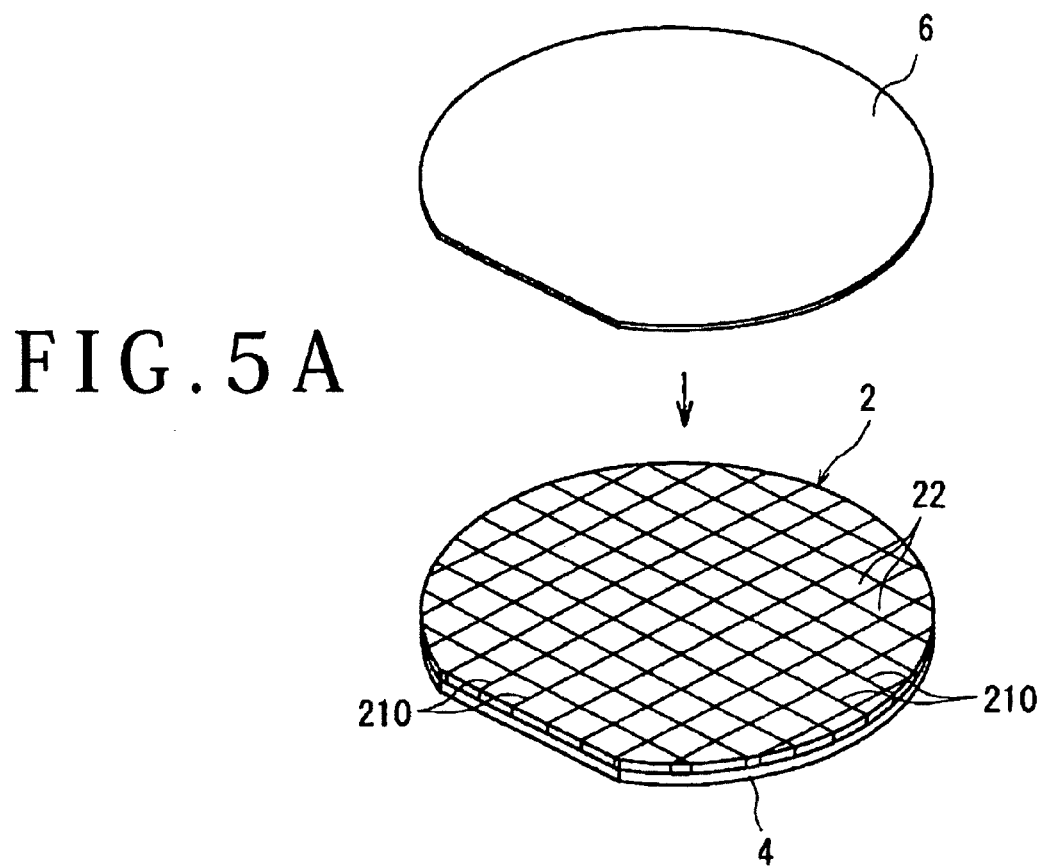
FIGS. 5A and 5B illustrate an adhesive film attaching step in the method of manufacturing a device based on the present invention.
Figure 5B:
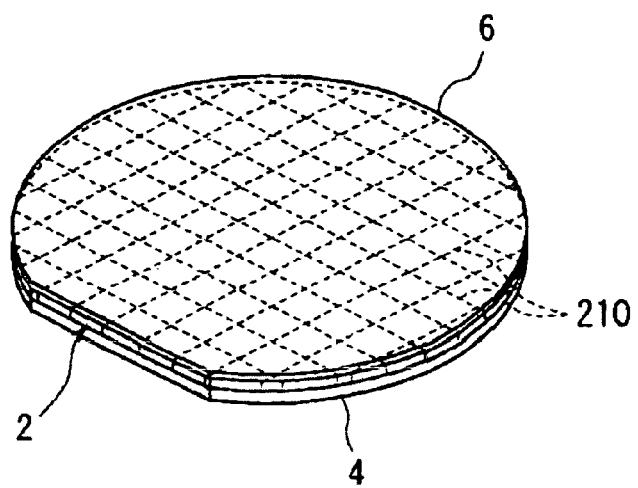

After the semiconductor wafer 2 is divided into the individual devices 22 by carrying out the wafer dividing step based on the dicing-before-grinding technique as above-mentioned, an adhesive film attaching step is conducted in which a die-bonding adhesive film to be cured by irradiation with UV rays is attached to the backside surface 2b of the semiconductor wafer 2 divided into the individual devices 22. Specifically, as shown in FIGS. 5A and 5B, the adhesive film 6 is attached to the backside surface 2b of the semiconductor wafer 2 divided into the individual devices 22. In this case, the adhesive film 6 is adhered by pressing it against the backside surface 2b of the semiconductor wafer 2 while heating it at a temperature of 80 to 200° C. as above-mentioned. Incidentally, as the adhesive film to be cured by irradiation with UV rays, for example, the adhesive film disclosed in Japanese Patent Laid-Open No. Hei 2-32181 can be used.

Figure 6:
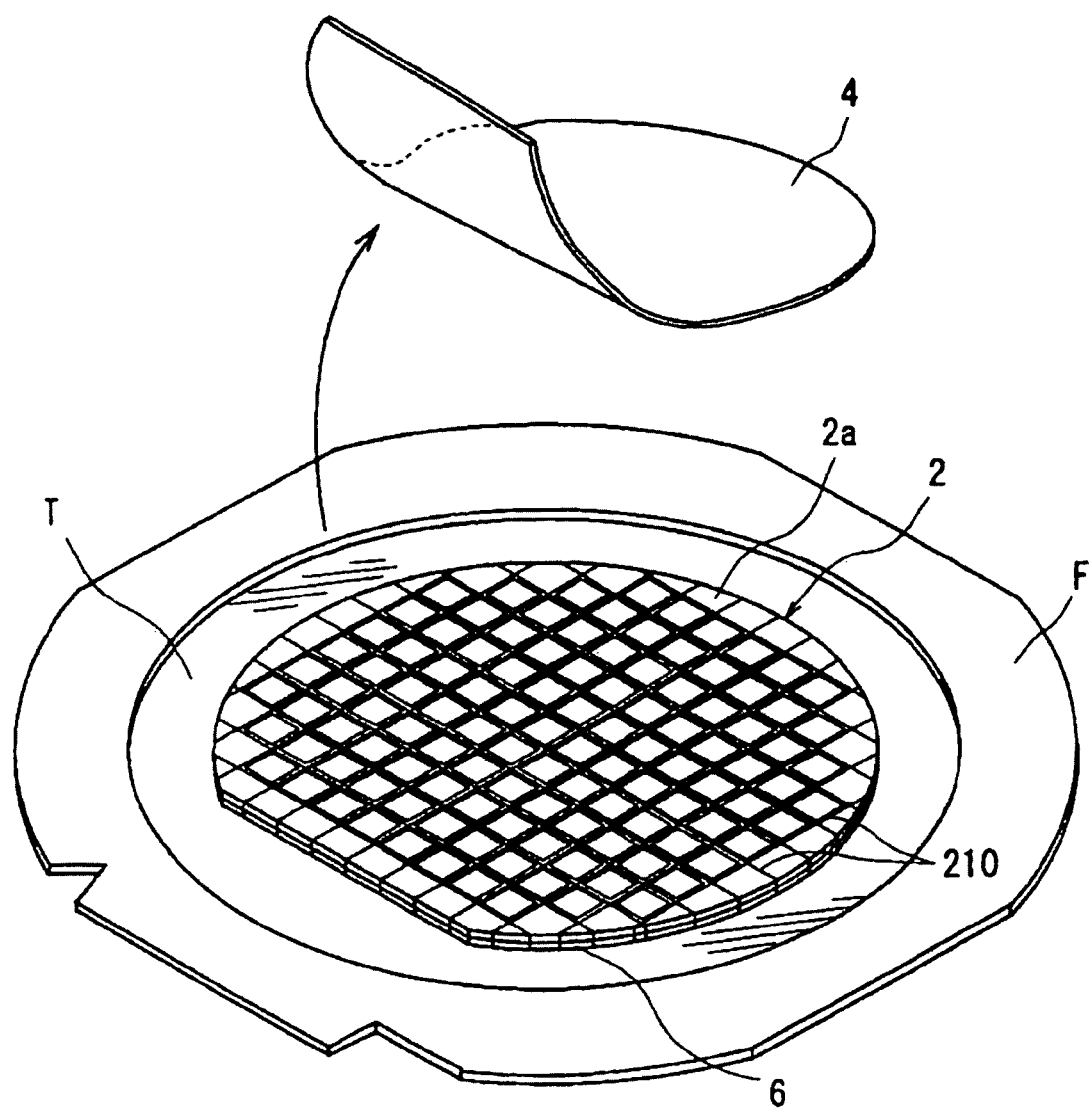
FIG. 6 illustrates a wafer supporting step in the method of manufacturing a device based on the present invention.

After the adhesive film attaching step is carried out as above-mentioned, a wafer supporting step is conducted in which the adhesive film 6 side of the semiconductor wafer 2 to which the adhesive film 6 has been attached is adhered to a surface of a dicing tape T attached to an annular frame F, as shown in FIG. 6. Then, the protective member 4 adhered to the face-side surface 2a of the semiconductor wafer 2 is peeled off (protective member peeling step). Incidentally, in the case of using a dicing tape with an adhesive film previously adhered to a surface thereof, the adhesive film adhered to the surface of the dicing tape is adhered to the backside surface 2b of the semiconductor wafer 2 divided into the individual devices 22 by carrying out the above-mentioned wafer dividing step. Then, the protective member peeling step as above-mentioned is carried out.

Figure 7A:
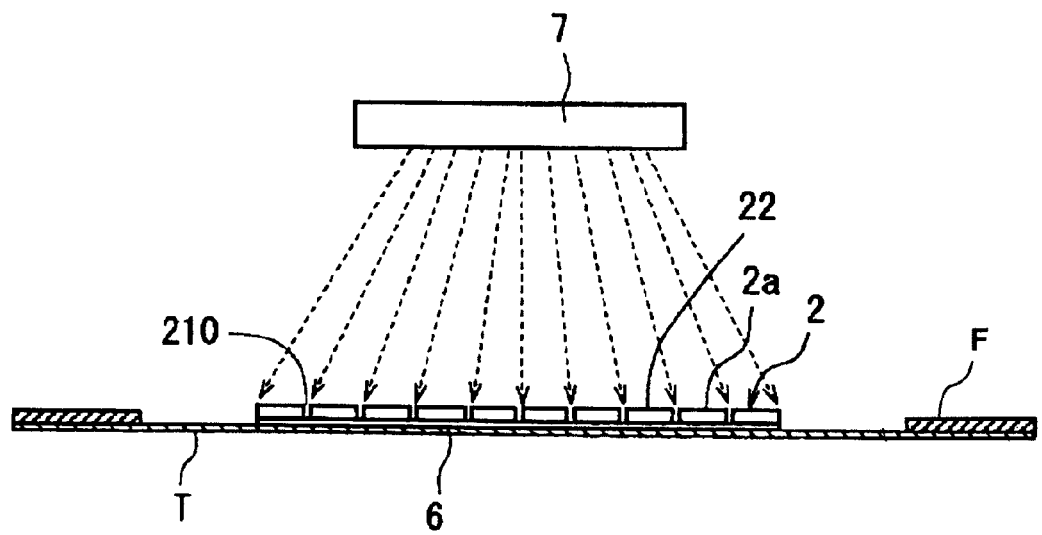
FIGS. 7A and 7B illustrate an adhesive film curing step in the method of manufacturing a device based on the present invention.

Subsequently, an adhesive film curing step is conducted in which UV rays are radiated from the side of the face-side surface 2a of the semiconductor wafer 2 adhered to the dicing tape T attached to the annular frame F so as to irradiate the adhesive film 6 with the UV rays through the dividing grooves 210 formed in the semiconductor wafer 2, whereby those regions of the adhesive film 6 which correspond to the dividing grooves 210 are cured. More specifically, as shown in FIG. 7A, UV rays are radiated from the side of the face-side surface 2a of the semiconductor wafer 2 adhered to the dicing tape T attached to the annular frame F, by a UV irradiation unit 7. Incidentally, the UV irradiation unit 7 has a metal halide lamp, and radiates UV rays with a wavelength of 365 nm, a luminance of 40 mW/cm$^2$ and an illuminance of 200 mJ/cm$^2$ for 5 sec.

Figure 7B:
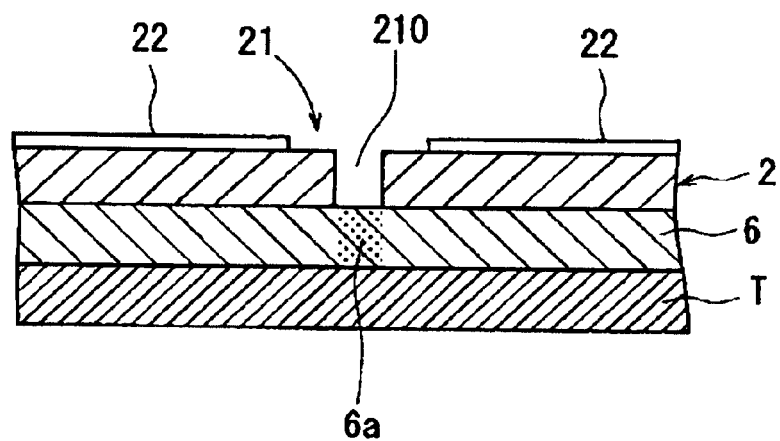

As a result, the adhesive film 6 is irradiated with the UV rays through the dividing grooves 210 formed in the semiconductor wafer 2, whereby the regions 6a of the adhesive film 6 which correspond to the dividing grooves 210 are cured, as shown in FIG. 7B. Incidentally, the adhesive film curing step may be carried out by irradiating the adhesive film 6 with a laser beam having a wavelength in the UV region through the dividing grooves 210 so as to cure those regions 6a of the adhesive film 6 which correspond to the dividing grooves 210.

After the adhesive film adhering step as above is conducted, an adhesive film dividing step is carried out in which a laser beam having such a wavelength as to permit absorption into the adhesive film 6 is radiated from the side of the face-side surface 2b of the semiconductor wafer 2 along the dividing grooves 210, whereby the adhesive film 6 having been cured along the dividing grooves 210 is divided on a device basis. The adhesive film dividing step is performed by use of a laser beam machining apparatus 8 shown in FIG. 8. The laser beam machining apparatus 8 shown in FIG. 8 includes a chuck table 81 for holding a work, laser beam irradiation means 82 for irradiating the work held on the chuck table 81 with a laser beam, and imaging means 83 for image the work held on the chuck table 81. The chuck table 81 is so configured as to hold the work by suction and to be moved in a machining feed direction of arrow X in FIG. 8 and an indexing feed direction of arrow Y by a moving mechanism (not shown).

The laser beam irradiation means 62 includes a cylindrical casing 821 disposed substantially horizontally. Pulsed laser beam oscillation means (not shown) including a pulsed laser beam oscillator, which includes a YAG laser oscillator or a YVO4 laser oscillator, and repetition frequency setting means is arranged inside the housing 821. A condenser 822 for condensing (converging) a pulsed laser beam oscillated from the pulsed laser beam oscillation means is mounted to a tip part of the casing 821. The imaging means 83 attached to a tip part of the casing 821 constituting the laser beam oscillation means 82, in the embodiment shown, includes an ordinary imaging device (CCD) for imaging by use of visible rays or the like, and it sends a picture signal obtained upon imaging to control means (not shown).

Figure 8:
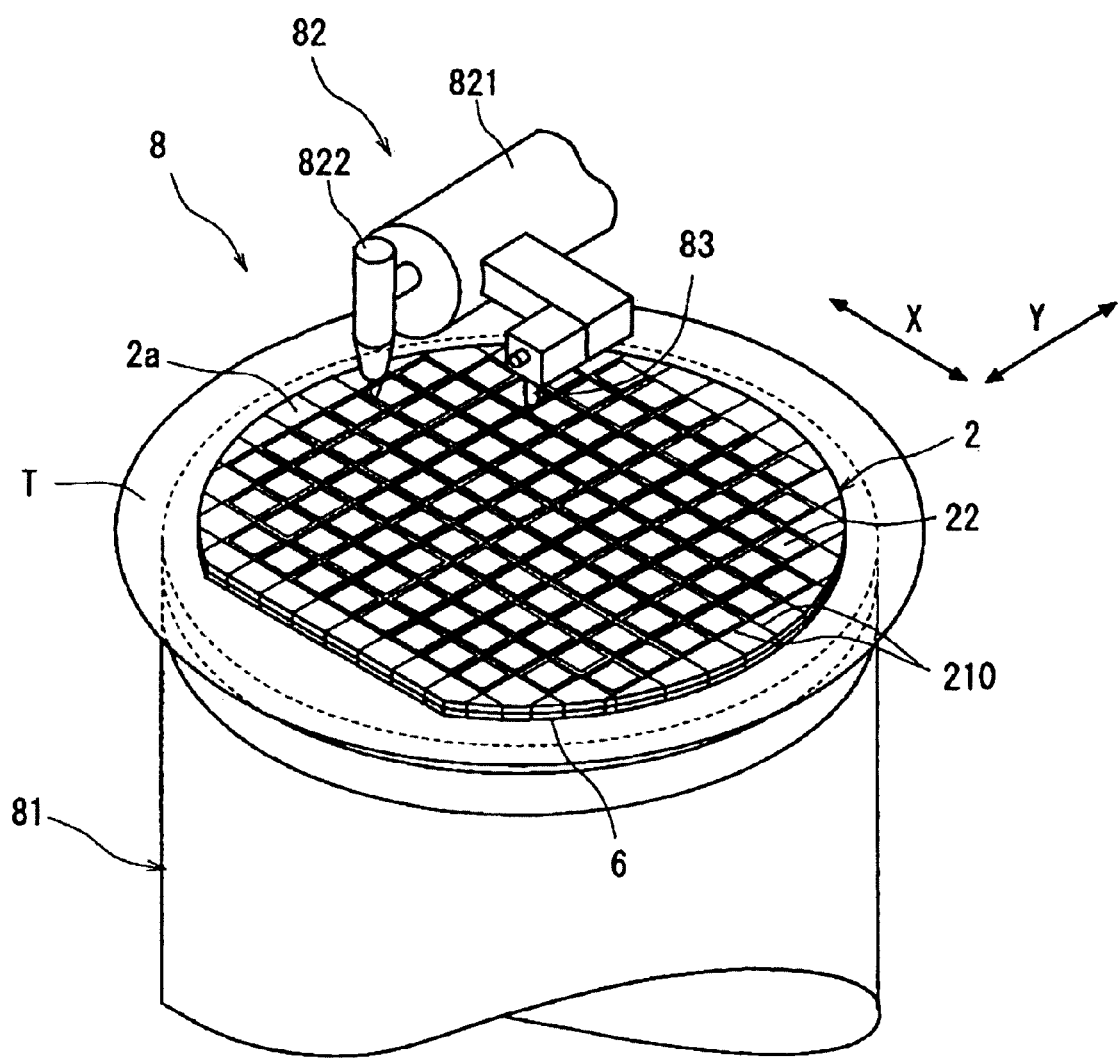
FIG. 8 is a perspective view of an essential part of a laser machining apparatus for carrying out the adhesive film dividing step in the method of manufacturing a device based on the present invention.

In carrying out the adhesive film dividing step by use of the laser beam machining apparatus 8 as above-mentioned, first, the dicing tape T to which the adhesive film 6 side of the semiconductor wafer 2 has been adhered is mounted on the chuck table 81 of the laser beam machining apparatus 8 shown in FIG. 8. Then, suction means (not shown) is operated, whereby the semiconductor wafer 2 is held on the chuck table 81 through the dicing tape T. Incidentally, while the annular frame F to which the dicing tape T is attached is omitted in FIG. 8, the annular frame F is held by appropriate frame holding means disposed at the chuck table 81. The chuck table 81 with the semiconductor wafer 2 held thereon by suction is positioned into a position directly under the imaging means 83 by the moving mechanism (not shown).

After the chuck table 81 is positioned in the position just under the imaging means 83, an alignment work of detecting the work region to be laser beam machined of the semiconductor wafer 2 by the imaging means 83 and the control means (not shown) is carried out. Specifically, the imaging means 83 and the control means (not shown) execute image processings such as pattern matching for matching the positions of the dividing groove 210 formed along the planned dividing line 21 formed in the wafer 2 in a predetermined direction and the condenser 822 of the laser beam irradiation means 82 for radiating the laser beam along the dividing groove 210, thereby carrying out alignment of the laser beam irradiation position (alignment step). In addition, for the dividing groove 210 formed along the planned dividing line 21 formed in the semiconductor wafer 2 to extend perpendicularly to the predetermined direction, also, similar alignment of a cutting region is carried out.

Figure 9A:
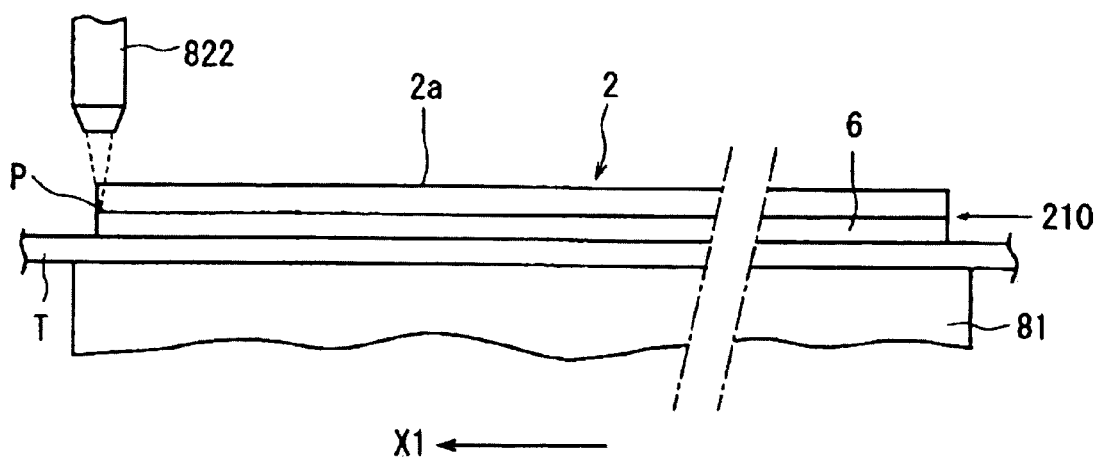
FIGS. 9A and 9B illustrate the adhesive film dividing step in the method of manufacturing a device based on the present invention.
Figure 9B:
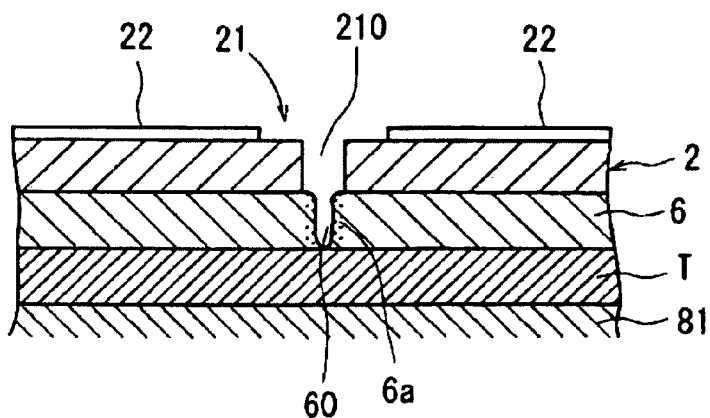

After the dividing grooves 210 formed along the planned dividing lines 21 formed in the semiconductor wafer 2 held on the chuck table 81 is detected and the alignment of the laser beam irradiation position is conducted as above-mentioned, the chuck table 81 is moved into a laser beam irradiation region where the condenser 822 of the laser beam irradiation means 82 for irradiation with a laser beam is located, as shown in FIG. 9A, and one end (the left end in FIG. 9A) of a predetermined dividing groove 210 is positioned into a position directly under the condenser 822. Then, while irradiating the adhesive film 6 with a pulsed laser beam from the condenser 822 through the dividing groove 210 formed in the semiconductor wafer 2, the chuck table 81 is moved at a predetermined feed rate in the direction of arrow X1 in FIG. 9A, and, when the other end (the right end in FIG. 9A) of the dividing groove 210 has reached the irradiation position of the condenser 822, irradiation with the pulsed laser beam is stopped and the movement of the chuck table 81 is stopped. In this case, the pulsed laser beam radiated from the condenser 822 of the laser beam irradiation means 82, in the embodiment shown, is radiated so that the converging point P (the point where a converged beam spot is formed) coincides with the upper surface of the adhesive film 6. Incidentally, the wavelength of the laser beam is set to 355 nm, which permits the laser beam to be absorbed into the film material (a mixture of an epoxy resin and an acrylic resin) constituting the adhesive film 6. As a result, as shown in FIG. 9B, laser beam machined grooves 60 are formed in the adhesive film 6 along the dividing grooves 210 by the energy of the laser beam, whereby the adhesive film 6 is divided on the basis of each device 22.

Incidentally, the machining conditions in the above-mentioned adhesive film dividing step are set, for example, as follows.

Kind of laser beam: LD excited Q switch YAG laser
Wavelength: 355 nm
Repetition frequency: 100 kHz
Mean output: 1 W
Convergent spot diameter: φ15 μm
Machining feed rate: 100 mm/sec In this manner, the adhesive film dividing step is applied to all the dividing grooves 210 formed along the planned dividing lines 21 formed in the semiconductor wafer 2, whereby the adhesive film 6 is divided on the basis of each device 22.

Here, of the adhesive film 6, the regions 6a corresponding to the dividing grooves 210 have been cured by irradiation with UV rays in the adhesive film curing step as above-mentioned. In carrying out the adhesive film dividing step, therefore, the laser beam is used for ablation without being used for curing of the regions 6a corresponding to the dividing grooves 210, so that good absorption is ensured. Accordingly, the adhesive film 6 can be cut by a laser beam with a weak output of about 1 W, so that generation of debris can be restrained. In addition, since the cured regions 6a of the adhesive film 6 are irradiated with the laser beam, the adhesive film 6 is securely cut along the laser beam with which it is irradiated, i.e., it is divided clearly along the devices 22.

After the above-mentioned adhesive film dividing step is performed, a pick-up step is carried out wherein the devices 22 to which the adhesive film 6 divided on the basis of each device 22 is adhered are picked up by releasing them from the dicing tape T. The pick-up step is carried out by use of a picking-up apparatus shown in FIG. 10. The picking-up apparatus 9 includes a base 91, a first table 92 disposed on the base 91 so as to be movable in a direction of arrow Y, and a second table 93 disposed on the first table 92 so as to be movable in a direction of arrow X orthogonal to the direction of arrow Y. The base 91 is rectangular in shape, and two guide rails 911, 912 parallel to each other are arranged on the upper surfaces of both side parts of the base 91, along the direction of arrow Y. Incidentally, of the two guide rails 911 and 912, one 911 is provided in its top face with a guide groove 911a which is V-shaped in section.

The first table 92 has a window frame-like shape and is provided with a rectangular aperture 921 in its central part. The first table 92 is provided, at the lower surface of one side part thereof, with a guided rail 922 to be slidably fitted in the guide groove 911a formed in the guide rail 911 on one side provided on the base 91. In addition, two guide rails 923, 924 parallel to each other are arranged on the upper surfaces of both side parts of the first table 92, along a direction orthogonal to the guided rail 922. Incidentally, of the two guide rails 923 and 924, one 923 is provided in its top face with a guide groove 923a which is V-shaped in section. Of the first table 92 configured as above, the guided rail 922 is fitted in the guide groove 911a formed in the guide rail 911 on one side provided on the base 91, and the lower surface of a side part on the other side is mounted on the guide rail 912 on the other side provided on the base 91. The picking-up apparatus 9 in the embodiment shown has first moving means 94 by which the first table 92 is moved in the direction of arrow Y along the guide rails 911, 912 provided on the base 91.

The second table 93 is rectangular in shape, and is provided, at the lower surface on one side part thereof, with a guided rail 932 to be slidably fitted in the guide groove 923a formed in the guide rail 923 on one side provided on the first table 92. Of the second table 93 configured as above, the guided rail 932 is fitted in the guide groove 923a formed in the guide rail 923 on one side provided on the first table 92, and the lower surface of its side part on the other side is mounted on the guide rail 924 on the other side provided on the first table 92. The picking-up apparatus 9 in the embodiment shown has second moving means 95 by which the second table 93 is moved in the direction of arrow X along the guide rails 923, 924 provided on the first table 92.

The picking-up apparatus 9 in the embodiment shown includes frame holding means 96 for holding the above-mentioned annular frame F, and tape expanding means 97 for expanding the dicing tape T attached to the annular frame F held by the frame holding means 96. The frame holding means 96 includes an annular frame holding member 961, and a plurality of clamps 962 as fixing means which is arranged at the outer periphery of the frame holding member 961. The upper surface of the frame holding member 961 constitutes a mount surface 961*a* on which to mount the annular frame F, and the annular frame F is mounted on the mount surface 961*a*. The annular frame F mounted on the mount surface 961*a* is fixed to the frame holding member 961 by the clamps 962. The frame holding means 96 thus configured is disposed on the upper side of the second table 93, and is supported so as to be movable in the vertical direction by the tape expanding means 97 which will be described later.

The tape expanding means 97 has an expansion drum 970 disposed on the inner side of the annular frame holding member 961. The expansion drum 970 has an inside diameter and an outside diameter which are smaller than the inside diameter of the annular frame F and larger than the outside diameter of the semiconductor wafer 2 adhered to the dicing tape T attached to the annular frame F. In addition, the expansion drum 970 is provided, at its lower end part, with an attaching part to be turnably fitted in the inner peripheral surface of a hole (not shown) provided in the second table 93, and is provided, at the outer peripheral surface on the upper side of the attaching part, with a support flange 971 formed to project in the radial direction.

The tape expanding means 97 in the embodiment shown has support means 972 by which the annular frame holding member 961 can be advanced and retracted in the vertical direction. The support means 972 includes a plurality of air cylinders 973 arranged on the support flange 971, and piston rods 974 thereof are linked to the lower surface of the annular frame holding member 961. The support means 972 including the plurality of air cylinders 973 selectively moves the annular frame holding member 961 into a reference position where the mount surface 961*a* is roughly at the same level as the upper end of the expansion drum 970 as shown in FIGS. 10 and 11A, and into an expansion position where the mount surface 961*a* is spaced by a predetermined amount downwards (in the figure) from the upper end of the expansion drum 970 as shown in FIG. 11B.

Figure 10:
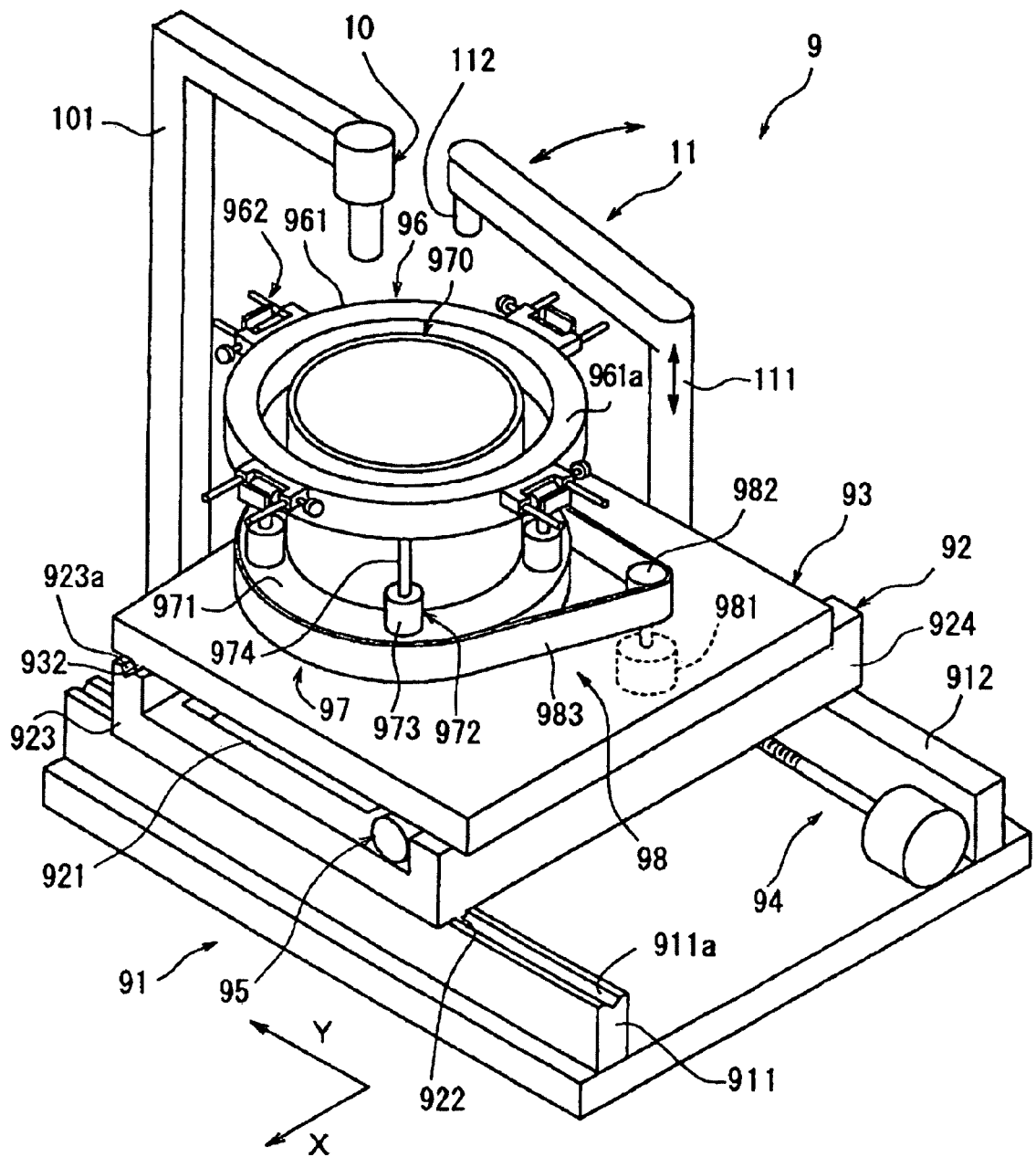
FIG. 10 is a perspective view of a picking-up apparatus for carrying out a pick-up step in the method of manufacturing a device based on the present invention.

The picking-up apparatus 9 in the embodiment shown has turning means 98 for turning the expansion drum 970 and the frame holding member 961, as shown in FIG. 10. The turning means 98 includes a pulse motor 981 arranged on the second table 93, a pulley 982 attached to a rotary shaft of the pulse motor 981, and an endless belt 983 wrapped around the pulley 982 and the support flange 971 of the expansion drum 970. The turning means 98 thus configured is operative, by driving the pulse motor 981, to turn the expansion drum 970 through the pulley 982 and the endless belt 983.

The picking-up apparatus 9 in the embodiment shown has detecting means 10 for detecting the individually divided device 22 of the semiconductor wafer 2 supported through the dicing tape T on the annular frame F held by the annular frame holding member 961. The detecting means 10 is attached to an L-shaped support column 101 disposed on the base 91. The detecting means 10 includes an optical system, an imaging device (CCD) and the like, and is operative to image (shoot) the individually divided device 22 of the semiconductor wafer 2 supported through the dicing tape T on the annular frame F held by the annular frame holding member 961, to convert the thus obtained image into an electrical signal, and to send the electrical signal to control means (not shown).

In addition, the picking-up apparatus 9 in the embodiment shown has picking-up means 11 for picking up the individually divided devices 22 from the dicing tape T. The picking-up means 11 includes a slewing arm 111 disposed on the base 91, and a picking-up collet 112 attached to the tip of the slewing arm 111, and the slewing arm 111 is slewed by driving means (not shown). Incidentally, the slewing arm 111 can be moved upwards and downwards, and the picking-up collet 112 attached to the tip of the slewing arm 111 can pick up the individually divided device 22 adhered to the dicing tape T.

The picking-up apparatus 9 in the embodiment shown is configured as above, and the pick-up step carried out by use of the picking-up apparatus 9 will be described below referring mainly to FIGS. 11A to 12. The annular frame F supporting, through the dicing tape T, the individual devices 22 with the adhesive film 6 attached to the back side thereof after the above-mentioned adhesive film dividing step is conducted is mounted on the mount surface 961*a* of the frame holding member 961 constituting the frame holding means 96, as shown in FIG. 11A, and the annular frame F is fixed to the frame holding member 961 by the clamps 962 (frame holding step). In this instance, the frame holding member 961 is positioned in the reference position shown in FIG. 11A.

After the annular frame F supporting, through the dicing tape T, the individual devices 22 with the adhesive film 6 attached to the back side thereof is fixed to the frame holding member 961 positioned in the reference position as shown in FIG. 11A, the plurality of air cylinders 973 as the support means 972 constituting the tape expanding means 97 are operated to lower the annular frame holding member 961 to the expansion position shown in FIG. 11B. Therefore, the annular frame F fixed on the mount surface 961*a* of the frame holding member 961 is also lowered, so that the dicing tape T attached to the annular frame F is brought into contact with the upper end edge of the expansion drum 970 and expanded (tape expanding step). As a result, tensile forces in radial directions are exerted on the adhesive film 6 adhered to the dicing tape T, so that in the case where the adhesive film 6 has not been completely cut along the individual devices 22 in the above-mentioned adhesive film dividing step, the adhesive film 6 is completely cut along the individual devices 22 by the tape expanding step now carried out. Besides, gaps S between the individual devices 22 with the adhesive film 6 attached thereto are broadened.

After the tape expanding step is carried out as above, the first moving means 94 and the second moving means 95 are operated to move the first table 92 in the direction of arrow Y (see FIG. 10) and move the second table 93 in the direction of arrow X (see FIG. 10) so that the individual device 22 adhered through the adhesive film 6 to the dicing tape T attached to the annular frame F held by the frame holding member 961 is positioned into a position directly under the detecting means 10. Then, the detecting means 10 is operated to check whether or not the gap between the individual devices 22 coincides with the direction of arrow Y or the direction of arrow X. If the gap between the individual devices 22 is found deviated from the direction of arrow Y or the direction of arrow X, the turning means 98 is operated to turn the frame holding means 96 so as to achieve the coincidence expected.

Figure 12:
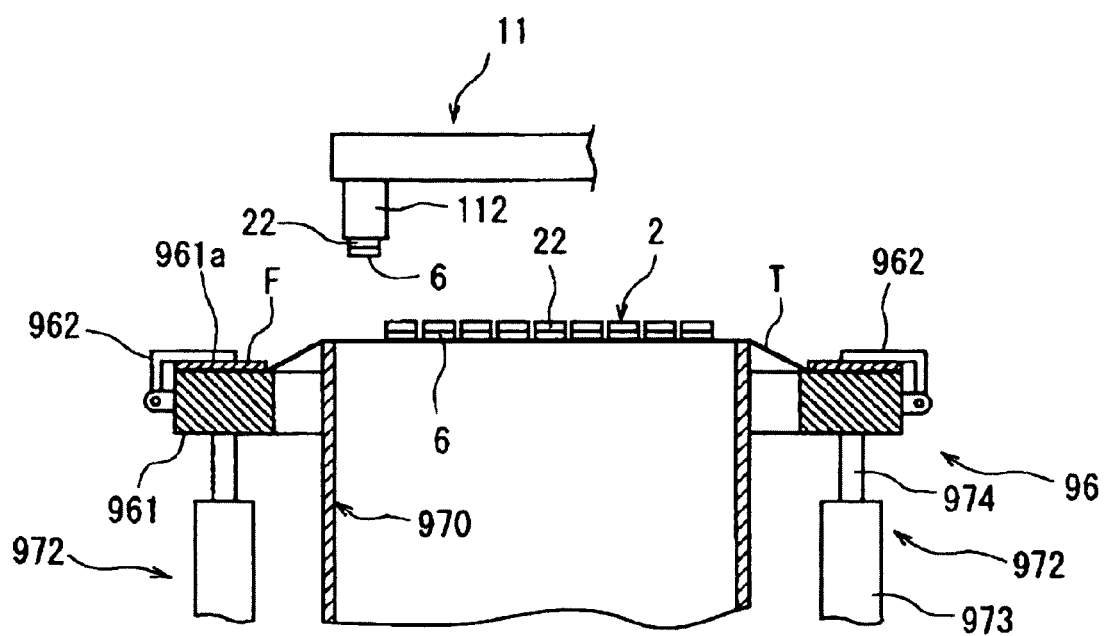
FIG. 12 illustrates the pick-up step in the method of manufacturing a device based on the present invention.

Next, while moving the first table 92 in the direction of arrow Y (see FIG. 10) and moving the second table 93 in the direction of arrow X (see FIG. 10), the picking-up means 11 is operated to suck the device 22 (with the adhesive film 6 attached to the back side thereof) positioned in a predetermined position by the picking-up collet 112 and to release the device 22 from the dicing tape T, thereby picking up the device 22 (pick-up step), as shown in FIG. 12, and the device 22 is fed onto a tray (not shown) or to a die bonding step. In the pick-up step, the device 22 can be easily picked up without interference with the adjacent device(s), since the gaps S between the individual devices 22 with the adhesive film 6 attached thereto have been broadened as above-mentioned.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a device, for dividing a wafer provided with devices formed in a plurality of regions demarcated by planned dividing lines formed in a lattice pattern in a face-side surface thereof, into individual devices, said method comprising:

a wafer dividing step of forming dividing grooves in a predetermined depth along said planned dividing lines from a face side of said wafer, then grinding a backside surface of said wafer to expose said dividing grooves on a backside of said wafer and dividing said wafer into said individual devices;

an adhesive film attaching step of attaching a UV-curing adhesive film to said backside surface of said wafer divided into said individual devices;

a wafer supporting step of adhering an adhesive film side of said wafer with said adhesive film attached thereto to a surface of a dicing tape attached to an annular frame;

an adhesive film curing step of radiating UV rays from the face side of said wafer adhered to said dicing tape so as to irradiate said adhesive film with said UV rays through said dividing grooves formed in said wafer and thereby to cure those regions of said adhesive film which correspond to said dividing grooves;

an adhesive film dividing step of radiating a laser beam having such a wavelength as to permit absorption into said adhesive film, from the face side of said wafer and along said dividing grooves, so as to divide said cured adhesive film on a device basis along said dividing grooves; and a pick-up step of releasing from said dicing tape, and picking up, each said device to which said adhesive film divided on the device basis has been attached.

2. The method of manufacturing the device as set forth in claim 1, wherein said pick-up step includes a tape expanding step of expanding said dicing tape so as to broaden the gaps between said devices, before releasing from said dicing tape each said device to which said adhesive film has been attached.

* * * * *